United States Patent
Kuge et al.

(10) Patent No.: US 6,438,067 B2
(45) Date of Patent: Aug. 20, 2002

(54) CLOCK GENERATING CIRCUIT ENSURING A WIDE LOCK-ALLOWING FREQUENCY RANGE AND ALLOWING REDUCTION IN LAYOUT AREA AS WELL AS A SEMICONDUCTOR DEVICE PROVIDED WITH THE SAME

(75) Inventors: Shigehiro Kuge; Takeshi Hamamoto, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/773,637

(22) Filed: Feb. 2, 2001

(30) Foreign Application Priority Data

Apr. 18, 2000 (JP) .......................................... 12-116632

(51) Int. Cl.[7] .............................................. G11C 8/00
(52) U.S. Cl. .................... 365/233; 365/194; 365/189.07
(58) Field of Search ........................... 365/233, 189.07, 365/194, 189.09; 327/362, 158, 277

(56) References Cited

U.S. PATENT DOCUMENTS 5,550,783 A * 8/1996 Stephens et al. ............ 365/233
5,742,195 A * 4/1998 Mizuno et al. .............. 327/362

FOREIGN PATENT DOCUMENTS

| JP | 402142215 A | * 5/1990 | ............ H03K/5/13 |
| JP | 4-213213 | 8/1999 | |

OTHER PUBLICATIONS

"2000 IEEE International Solid–State Circuits Conference, Digest of Technical Papers vol. 43, ISSN 0193–6530", pp. 402–403 and 472–475, published on Feb. 7, 2000.

* cited by examiner

Primary Examiner—David Nelms
Assistant Examiner—David Lam
(74) Attorney, Agent, or Firm—McDermott, Will & Emery

(57) ABSTRACT

A DLL circuit includes a delay circuit for producing an output clock signal by delaying an input clock signal, and a phase comparator circuit for making a comparison between phases of the output and input clock signals. The delay circuit includes a plurality of delay units each having a unit delay amount changing in accordance with a drive potential level. The DLL circuit further includes a delay control circuit for controlling activation of the delay units in accordance with the result of phase comparison of the phase comparator circuit, and a drive potential control circuit for controlling the drive potential in accordance with the result of phase comparison of the phase comparator circuit.

17 Claims, 12 Drawing Sheets

CLOCK GENERATING CIRCUIT ENSURING A WIDE LOCK-ALLOWING FREQUENCY RANGE AND ALLOWING REDUCTION IN LAYOUT AREA AS WELL AS A SEMICONDUCTOR DEVICE PROVIDED WITH THE SAME

BACKGROUND OF THE INVENTION

1. Field of the Invention

The present invention relates to a clock generating circuit used in a semiconductor memory device, and particularly relates to a clock generating circuit which generates an internal clock signal synchronized with an externally applied clock signal by means of a digital DLL (Delay Locked Loop) as well as a semiconductor memory device provided with the same.

2. Description of the Background Art

For generating a clock signal within a semiconductor memory device, such an technique has been known that a clock generating circuit (which will also be referred to merely as a "DLL circuit" hereinafter) employing the digital DLL is used for delaying a phase of an externally applied clock signal, and thereby the internal clock signal synchronized with the external clock is generated. This technique is particularly important in an SDRAM (Synchronous Dynamic Random Access Memory).

FIG. 12 is a block diagram showing a structure of a clock generating circuit 500 in the prior art employing the digital DLL.

Referring to FIG. 12, clock generating circuit 500 includes a delay circuit 510 which delays an input clock signal SIGIN of a cycle time Tcyc, a phase comparator circuit 520 which makes a comparison between phases of an output clock signal SIGOUT generated from delay circuit 510 and input clock signal SIGIN, and a delay control circuit 530 which controls the amount of delay of delay circuit 510 in accordance with the result of comparison of phase comparator circuit 520.

Delay circuit 510 is also called a "delay line" and, for example, includes delay units 515-1-515-$n$ each providing a delay amount td. In this case, delay control circuit 530 operates in response to the result of phase comparison of phase comparator circuit 520 to increase or decrease the number of delay units to be activated in delay circuit 510. In general, each of delay units 515-1-515-$n$ in delay circuit 510 employs a semiconductor element circuit such as an inverter, which is formed of field-effect transistors.

As described above, the total delay amount provided by delay circuit 510 is controlled in accordance with the result of phase comparison so that the output clock signal SIGOUT is delayed by the amount equal to one cycle time Tcyc from input clock signal SIGIN, whereby it is possible to produce the clock signal having the phase coincident with that of the input clock signal. In the following description, the state where the phases of the input and output clock signals are coincident with each other will also be referred to as a "locked state".

In general, the clock generating circuit in the prior art uses a Voltage Down Converter (which will also be referred to merely as a "VDC" hereinafter) for stabilizing a drive potential Vc of these delay units so that delay amount td of each delay unit is set to a constant value. Additionally, the number of delay units to be activated is controlled. Thereby, the synchronized state is ensured.

However, in a field-effect transistor such as an MOS transistor forming an inverter, a channel resistance has a temperature dependency. More specifically, the channel resistance value is small in a low temperature region, and is large in a high temperature region.

In accordance with this characteristic, the inverter formed of the MOS transistors delays the signal by a small amount in the low temperature region, and delays it by a large amount in the high temperature region. Accordingly, the delay unit provides delay amount td, which is variable depending on the temperature region, and more specifically, provides delay amount td, which is small in the low temperature region, and is large in the high temperature region, even if the delay unit has the constant structure.

FIG. 13 conceptually shows a problem relating to temperature conditions of a clock generating circuit 500 in the prior art.

Referring to FIG. 13, temperatures Tn and Tx correspond to an operation-ensured range of clock generating circuit 500. For example, the range between Tn and Tx corresponds to the operation specification temperature range of the semiconductor memory device provided with clock generating circuit 500. In general, Tn is about −40° C., and Tx is about 120° C.

The ordinate gives the total delay amount which can be provided by delay circuit 510 in clock generating circuit 500. After clock generating circuit 500 entered the locked state, the locked state must be maintained by adjusting the total delay amount of delay circuit 510 in clock generating circuit 500. Accordingly, the total delay amount which can be applied by entire delay circuit 510 determines the lock-allowing frequency range, i.e., the frequency range allowing locking in clock generating circuit 500.

In FIG. 13, delay amount DT0 corresponds to the case where delay circuit 510 applies the minimum delay amount at minimum specified temperature Tn. In this case, the minimum number of delay units are activated. Delay amount DT1 is a total delay amount in the case where the minimum number of delay units are activated at maximum specified temperature Tx.

Delay amount DT2 is applied in the case where all the delay units are activated at minimum specified temperature Tn, and is given by n·td in connection with the number and amount in FIG. 12. At the maximum specified temperature Tx, delay amount td per unit increases in accordance with increase in channel resistance caused by rise in temperature, and therefore the total delay amount, which is obtained by activating all the delay units, takes on a value of DT3 larger than DT2. Frequencies f0–f3 correspond to inverses of total delay amounts DT0–DT3, respectively, and establish a relationship of f3<f2<f1<f0.

The lock-allowing frequency range at maximum specified temperature Tx is between f1 and f3, but the lock-allowing frequency range at minimum specified temperature Tn is between f0 and f2, and therefore is significantly narrow. In a hatched region in FIG. 13, therefore, the total delay amount is not enough to synchronize the input and output clock signals with each other. As a result, only the range of f1–f2 forms the lock-allowing operation frequency range in the whole range according to the operation specifications relating to the temperature.

As described above, the lock-allowing frequency range changes to a large extent particularly on the low frequency side in accordance with variations in temperature conditions. Therefore, clock generating circuit 500 in the prior art must be provided with an appropriate number of delay units, which are required for ensuring the operation frequency range on the low frequency side with respect to the minimum specified temperature. This causes a problem of increase in layout area.

SUMMARY OF THE INVENTION

An object of the invention is to provide a clock generating circuit which can ensure a wide lock-allowing frequency range while requiring a small layout area.

Another object of the invention is to provide a semiconductor memory device provided with a clock generating circuit which generates an internal clock signal in synchronization with an external clock signal, and can ensure a wide lock-allowing frequency range while requiring a small layout area.

In summary, a clock generating circuit includes a delay circuit, a phase comparator circuit, a drive potential control circuit and a delay control circuit.

The delay circuit delays the input clock signal and outputs the delayed input clock signal. The delay circuit includes a plurality of delay units for delaying the input clock signal by a first delay amount obtained by multiplying a first unit delay amount by L (L: a natural number), and the first unit delay amount changes in accordance with a drive potential of the plurality of delay units. The phase comparator circuit makes a comparison between phases of the input clock signal and the output signal of the delay circuit. The drive potential control circuit controls the drive potential in response to a result of phase comparison of the phase comparator circuit. The delay control circuit controls L in response to the result of phase comparison.

According to another aspect, a clock generating circuit includes a delay circuit, a phase comparator circuit and a drive potential control circuit.

The delay circuit is supplied with a drive potential for operating to delay an input clock signal by a delay amount corresponding to the drive potential and output the delayed input clock signal. The phase comparator circuit makes a comparison between phases of the input clock signal and the output signal of the delay circuit. The drive potential control circuit controls the drive potential in response to the result of phase comparison of the phase comparator circuit.

According to still another aspect of the invention, a semiconductor memory device operating in synchronization with an external clock signal includes a memory cell array, a data terminal, a buffer circuit and a clock generating circuit.

The memory cell array has a plurality of memory cells arranged in rows and columns. The data terminal inputs and outputs data for writing and reading with respect to the memory cell array. The buffer circuit executes data transmission between the memory cell array and the data terminal in response to an internal clock signal. The clock generating circuit generates the internal clock signal synchronized with the external clock signal.

The clock generating circuit includes a delay circuit for delaying the external clock signal to output the internal clock signal. The delay circuit has a plurality of delay units for delaying the external clock signal by a first delay amount obtained by multiplying a first unit delay amount by L (L: a natural number), and the first unit delay amount changes in accordance with a drive potential of the plurality of delay units. The clock generating circuit further includes a phase comparator circuit for making a comparison between phases of the external clock signal and the internal clock signal of the delay circuit, a drive potential control circuit for controlling the drive potential in response to the result of phase comparison of the phase comparator circuit, and a delay control circuit for controlling L in response to the result of phase comparison of the phase comparator circuit.

According to the invention described above, the following major advantages can be achieved. The delay amount of the delay circuit is changed also by reflecting the phase comparison result in the drive potential of the delay units. Therefore, the frequency range of the input clock signal, in which the synchronized state can be ensured, can be widened without increasing the number of the delay units. Accordingly, the layout of the clock generating circuit can be efficient.

Since the delay amount of the delay circuit is changed by reflecting the phase comparison result in the drive potential of the delay units, the frequency range of the input clock signal, in which the synchronized state can be ensured, can be widened on the lower frequency side without increasing the number of the delay units. Accordingly, the layout of the clock generating circuit can be efficient.

The internal clock synchronized with the external clock is generated by the clock generating circuit, in which the delay amount of the delay circuit can be changed also by reflecting the phase comparison result in the drive potential of the delay units. In the clock generating circuit, therefore, the frequency range of the external clock signal, in which the synchronized state can be ensured, can be widened without increasing the number of the delay units. Accordingly, the layout of the clock generating circuit can be efficient, and the layout area of the semiconductor memory device can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
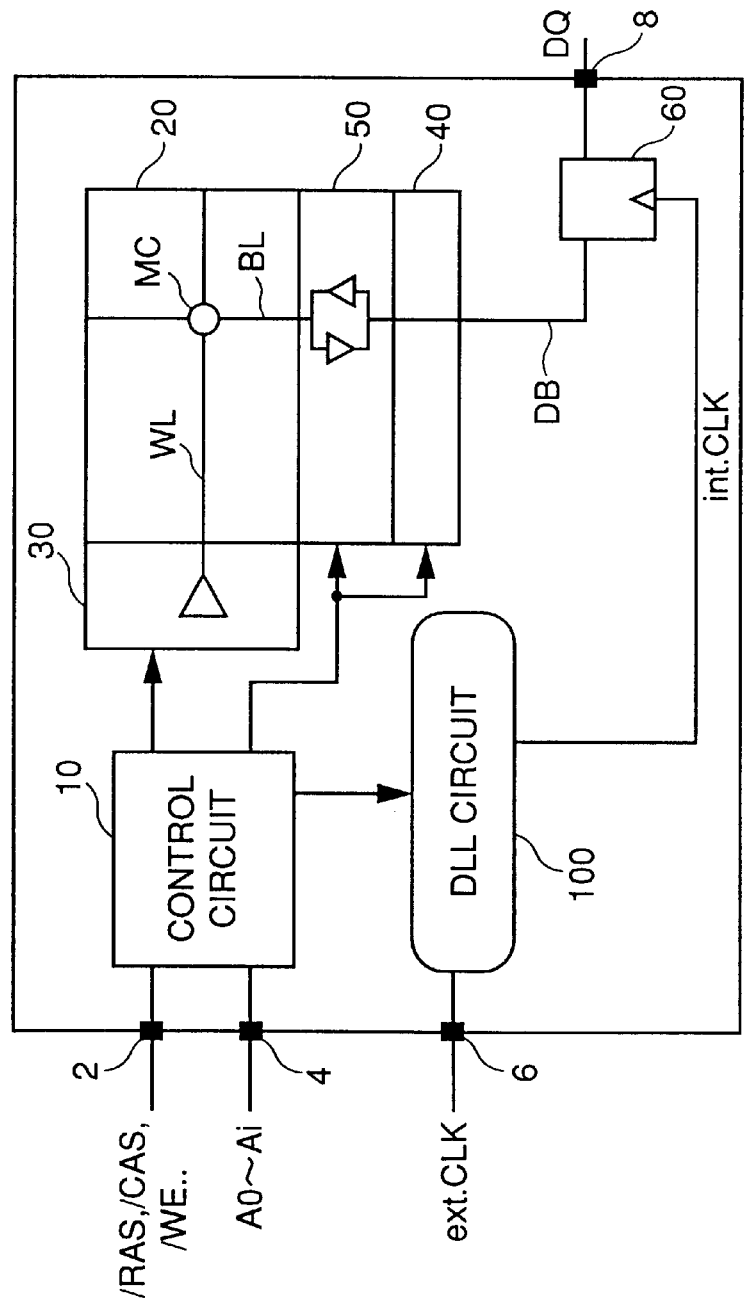
FIG. 1 is a schematic block diagram showing a structure of a semiconductor memory device 1 provided with a DLL circuit according to an embodiment of the invention.

Embodiment of the invention will now be described in greater detail with reference to the drawings. In the drawings, the same or corresponding parts and portions bear the same reference numbers.

First Embodiment

Referring to FIG. 1, a semiconductor memory device 1 provided with a DLL circuit according to an embodiment of the invention includes command control signal input terminals 2 for receiving command control signals such as a row address strobe signal /RAS, a column address strobe signal /CAS and a write enable signal /WE, address input terminals 4 for receiving address signals A0-Ai, a clock terminal 6 for receiving an external clock signal ext.CLK and a data I/O terminal 8 for transmitting data.

Semiconductor memory device 1 further includes a control circuit 10 which receives the control signals sent from command control signal input terminals 2 and the address signals sent from address input terminals 4, and controls the entire operation of semiconductor memory device 1, and a memory cell array 20 having a plurality of memory cells arranged in rows and columns. Memory cell array 20 is provided with word lines WL arranged corresponding to the respective rows of memory cells, and bit lines arranged corresponding to the respective columns of memory cells. Memory cells MC are arranged corresponding to the crossings between word lines WL and bit lines BL, respectively. FIG. 1 shows by way of example arrangement of various signal lines for single memory cell MC.

Semiconductor memory device 1 further includes a row decoder 30 for selectively driving word lines WL, a column decoder 40 for selecting the memory cell column corresponding to the address signal, a read/write circuit 50 which executes reading/writing of the output/input data with respect to bit line BL corresponding to the memory cell column selected by column decoder 40, a data bus DB for transmitting read/write data, and an I/O buffer 60 which executes data transmission between data bus DB and data I/O terminal 8.

Semiconductor memory device 1 further includes a DLL circuit 100 which receives external clock signal ext.CLK from clock terminal 6, and produces an internal clock signal int.CLK, which is transmitted to I/O buffer 60. I/O buffer 60 executes input/output of data signals transmitted via data I/O terminal 8 in response to internal clock signal int.CLK.

Figure 2:
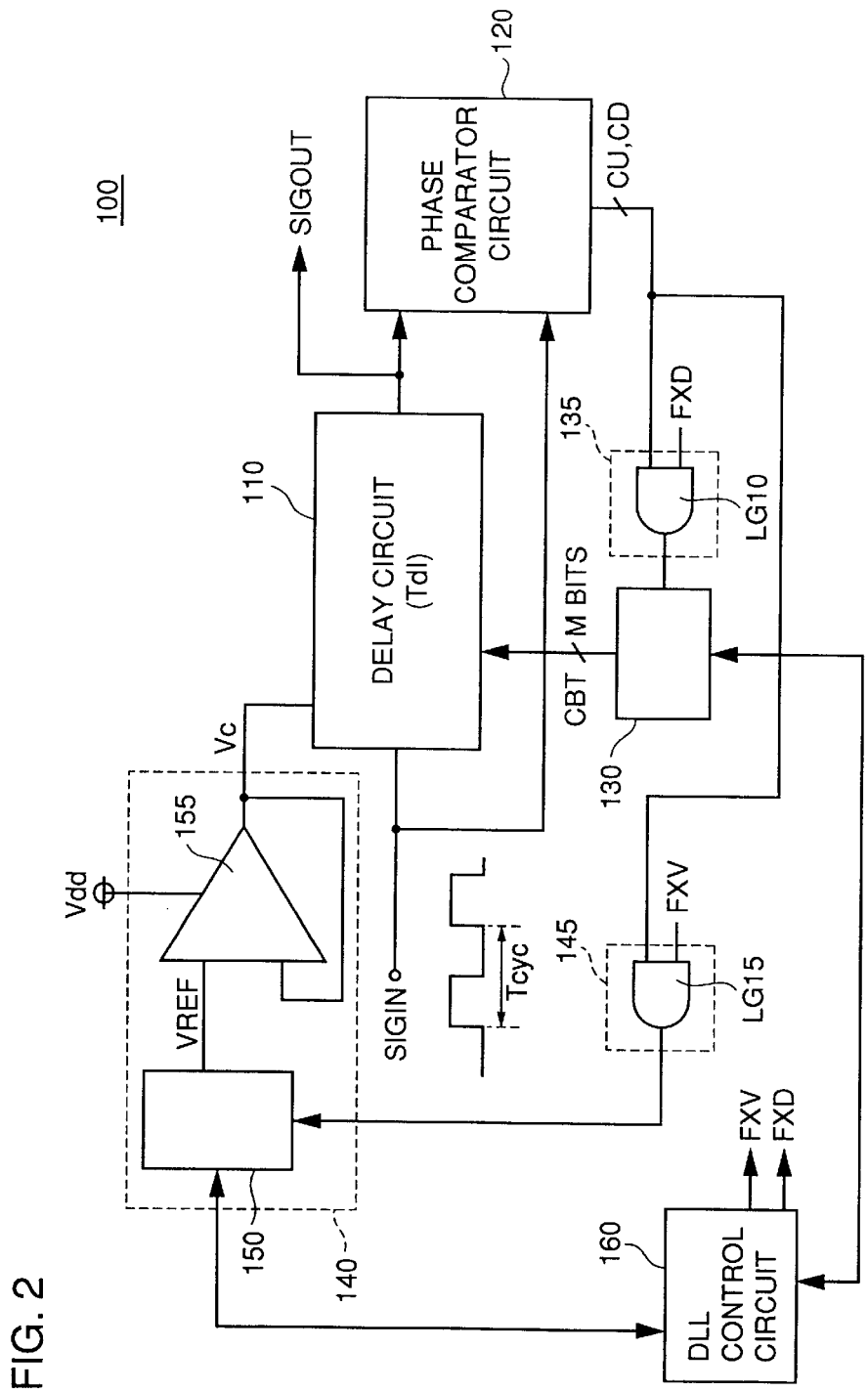
FIG. 2 is a block diagram showing a structure of a DLL circuit 100 according to a first embodiment of the invention.

Referring to FIG. 2, DLL circuit 100 according to the first embodiment of the invention includes a delay circuit 110 which delays input clock signal SIGIN having a cycle time Tcyc by a total delay amount Tdl, and produces output clock signal SIGOUT, a phase comparator circuit 120 which makes a comparison between phases of output clock signal SIGOUT and input clock signal SIGIN, a delay control circuit 130 which controls delay circuit 110 in accordance with the result of phase comparison of phase comparator circuit 120, and a drive potential control circuit 140 which controls a drive potential Vc supplied to delay circuit 110 in accordance with the result of phase comparison of phase comparator circuit 120.

The phase comparator circuit 120 produces a count-up signal CU for instructing increase of total delay amount Tdl and a count-down signal CD for instructing reduction of total delay amount Tdl.

Drive potential control circuit 140 includes a reference potential generating circuit 150 which raises or lowers stepwise a reference potential VREF of drive potential Vc of delay circuit 110 in response to the result of phase comparison, and a voltage regulator 155 which receives an external power supply potential Vdd, and issues drive potential Vc based on reference potential VREF.

In the first embodiment, delay circuit 110 is formed of a plurality of delay units having the same structures.

Figure 3:
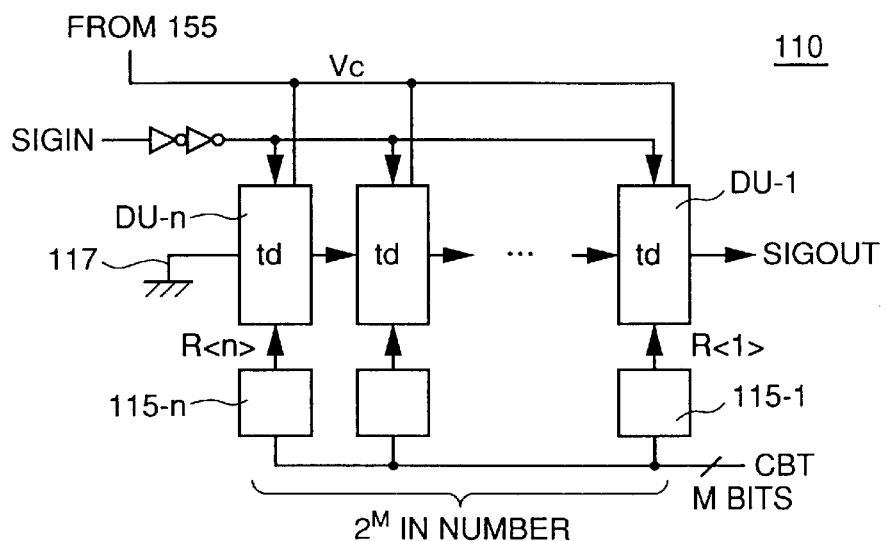
FIG. 3 is a block diagram showing a structure of a delay circuit 110.

Referring to FIG. 3, delay circuit 110 includes delay units DU-1-DU-n of n in number, and decode circuits 115-1-115-n corresponding to delay units DU-1-DU-n, respectively. Each of delay units DU-1–DU-n is driven by drive potential Vc supplied from voltage regulator 155.

Figure 4:
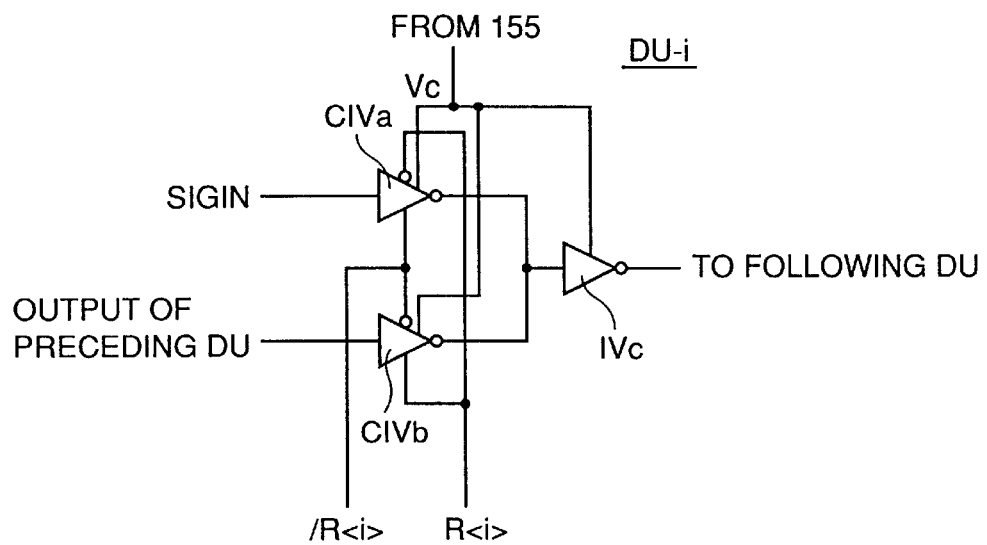
FIG. 4 is a circuit diagram showing a structure of a delay unit.

FIG. 4 shows a structure of the delay unit in an i-th (i: a natural number larger than 1 and smaller than n) position. Referring to FIG. 4, delay unit DU-i has clocked inverters CIVa and CIVb, which operate in response to a corresponding control signal R<i>, and an inverter IVc.

When delay unit DU-i is to be activated, control signal R<i> is set to H-level so that clocked inverter CIVb is activated, and clocked inverter CIVa is inactivated. Thereby, the output issued from the delay unit in the preceding position is further delayed by clocked inverters CIVb and inverter IVc, and is transmitted to the delay unit in the following position. The input node of clocked inverter CIVb in delay unit DU-n, which is located on the most upstream side with respect to the input clock signal, is joined to a ground node 117 which corresponds to the L-level potential of input clock signal SIGIN. Inverter IVc in delay unit DU-1 located on the most downstream side issues output clock signal SIGOUT.

When delay unit DU-i is to be deactivated, control signal R<i> is inactivated to attain L-level so that clocked inverter CIVa is activated, and clocked inverter CIVb is deactivated. In this case, therefore, input signal SIGIN is output after passing through clocked inverter CIVa and inverter IVc.

Signal transmission times of clocked inverters CIVa and CIVb as well as inverter IVc depend on drive potential Vc. This is because the signal transmission speed changes depending on a voltage between the source and gate in the field-effect transistor forming each inverter. More specifically, as drive potential Vc lowers, the signal transmission speed lowers, and delay amount td increases.

Unit delay amount td provided by the delay unit corresponds to a sum of the signal transmission times of inverter IVc and one of clocked inverters CIVa and CIVb. Since unit delay amount td changes depending on drive potential Vc, the total delay amount can be increased by lowering the drive potential without changing the number of the delay units.

Referring to FIG. 3 again, decode units 115-1-115-n provided corresponding to the respective delay units activate/inactivate corresponding control signals R<1>-R<n> in accordance with a count signal CBT of M bits produced by the delay control circuit.

Delay control circuit 130 counts up or down count signal CBT in response to count-up signal CU or count-down signal CD issued from phase comparator circuit 120. In the structure shown in FIG. 3, since activation/inactivation of the delay units of n in number are controlled by decoding the count signal of M bits, a relationship of $n=2^M$ is established.

In accordance with count-up signal CU or count-down signal CD corresponding to the result of phase comparison, the value of count signal CBT is changed to adjust the number of the delay units to be activated in delay circuit 110 so that the delay amount provided by delay circuit 110 can be controlled.

As described above, DLL circuit 100 changes not only the number of active delay units in delay circuit 110 but also drive potential Vc of delay circuit 110 in accordance with the result of phase comparison between input and output clock signals SIGIN and SIGOUT. Therefore, delay circuit 110 can provide the total delay amount larger than that provided by DLL circuit 500 in the prior art, provided that both delay circuits 110 and 500 include the same number of delay units. Thereby, the phases of the input and output clock signals can be synchronized with each other over a wider frequency range, while employing the same structure of the delay circuit.

The DLL loop can be configured without employing delay control circuit 130 if all the delay units in delay circuit 110 are activated, and only drive potential Vc is controlled according to the result of phase comparison. As compared with the structure provided with delay circuit control circuit 130, however, the minimum value of total delay amount Tdl increases, and the lock-allowing frequency range is narrowed on the high frequency side.

Referring to FIG. 2 again, DLL circuit 100 further includes a count fixing circuit 135 arranged between phase comparator circuit 120 and delay circuit control circuit 130, a count fixing circuit 145 arranged between phase comparator circuit 120 and drive potential control circuit 140, and a DLL control circuit 160 which issues a delay circuit fixing signal FXD and a reference potential fixing signal FXV for controlling the frequency-locking operation of whole DLL circuit 100.

Count fixing circuit 135 executes or stops transmission of count-up signal CU and count-down signal CD to delay circuit control circuit 130 in accordance with the signal level of delay circuit fixing signal FXD. Count fixing circuit 145 likewise executes or stops transmission of count-up signal CU and count-down signal CD to drive potential control circuit 140 in accordance with the signal level of reference potential fixing signal FXV.

Count fixing circuit 135 includes a logic gate for issuing a result of AND operation between the signal representing the result of phase comparison and delay circuit fixing signal FXD. This logic gate is provided for each of count-up signal CU and count-down signal CD. However, these logic gates are generally represented as a logic gate LG1O in FIG. 2.

Likewise, count fixing circuit 145 includes a logic gate LG15 for issuing a result of AND operation between the signal representing the result of phase comparison and reference potential fixing signal FXV. Logic gate LG15 is provided for each of count-up signal CU and count-down signal CD, although generally represented as single logic gate LG15 in FIG. 2.

As described above, the output of only one of delay circuit control circuit 130 and drive potential control circuit 140 is changed in accordance with the result of phase comparison. Thereby, total delay amount Tdl can be controlled easily, and synchronization can be achieved easily.

Figure 5:
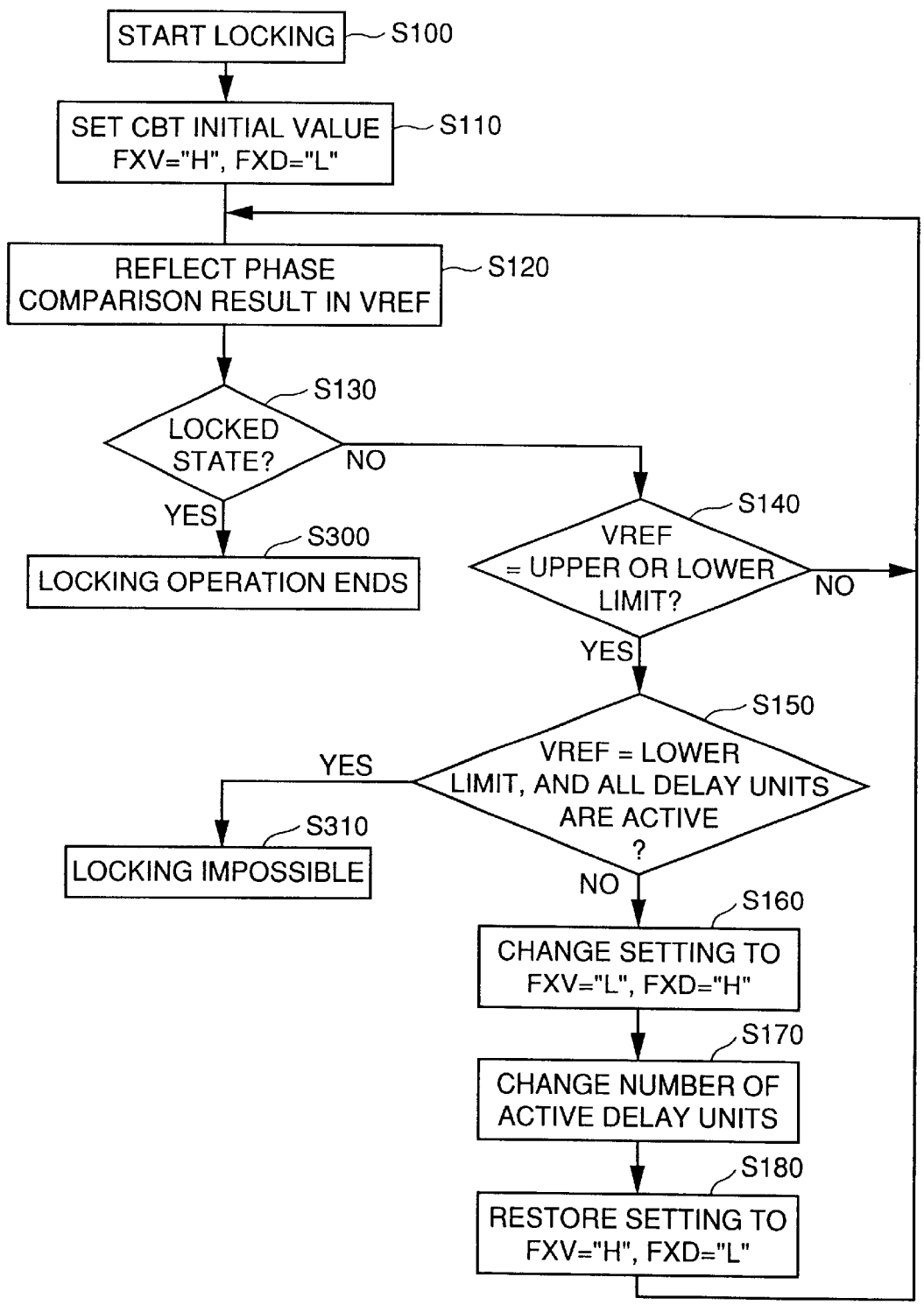
FIG. 5 is a flowchart showing control of a total delay amount in the first embodiment.

FIG. 5 is a flowchart showing the control of the total delay amount in the first embodiment.

As already described, delay circuit 110 in the first embodiment is formed of the plurality of delay units having the same structure. In this case, rough control is performed by controlling the number of delay units to be activated, and fine control is performed by controlling drive potential Vc, whereby the control can be performed efficiently.

Referring to FIG. 5, when DLL is once reset, new locking operation starts (step S100). When the locking operation starts, DLL control circuit 160 sets count signal CBT to a predetermined initial value, and delay circuit fixing signal FXD and drive potential fixing signal FXV are set to L-level and H-level, respectively (step S110).

Then, control of reference potential VREF for controlling drive potential Vc is executed in accordance with count-up signal CU and count-down signal CD produced by phase comparator circuit 120 (step S120). In accordance with reference potential VREF, total delay amount Tdl of delay circuit 110 also changes. As a result, input and output signals SIGIN and SIGOUT may be synchronized with each other, in which case the locked state is attained (step S130), and the locking operation ends (step S300).

Even when reference potential VREF is changed, the locked state may not be attained (step S130), in which case it is determined whether reference potential VREF has reached the upper or lower limit, or not (step S140). If reference potential VREF has reached neither the upper limit nor the lower limit, control of reference potential VREF will be repeated in accordance with the result of phase comparison.

When reference potential VREF has reached the upper or lower limit, it is necessary to determine the number of the active delay units in delay circuit 110(step S150). More specifically, when reference potential VREF has reached the lower limit, and all the delay units are active, it is impossible to ensure the total delay amount exceeding the current amount in delay circuit 110. Accordingly, DLL circuit 100 cannot perform the locking with respect to cycle time Tcyc of input clock signal SIGIN (step S310).

In the cases other than the above, the states of the drive potential fixing signal and the delay circuit fixing signal are changed between the active and inactive states so that drive potential fixing signal FXV is set to L-level, and delay circuit fixing signal FXD is set to H-level(step S160), whereby the active delay units in delay circuit 110 are increased or reduced in number in accordance with the result of phase comparison (step S170). Thereafter, for controlling the delay amount by the drive potential, the drive potential fixing signal and the delay circuit fixing signal are set to H- and L-levels, respectively (step S180). Thereby, drive potential Vc is controlled stepwise again, and the operation for synchronization is repeated.

According to the above manner, both the number of the active delay units in the delay circuit and the drive potential of the delay circuit can be efficiently controlled in accordance with the result of phase comparison. Therefore, efficient locking operations can be executed in DLL circuit 100, which is provided with delay circuit 110 of the compact structure and can be synchronized with frequencies in a large range.

Second Embodiment

The following second embodiment relates to a structure capable of setting more precisely the minimum unit of delay amount (which will also be referred to as a "minimum delay amount" hereinafter) which can be controlled in delay circuit 110. The DLL circuit according to the second embodiment includes a delay circuit different from delay circuit 110 shown in FIG. 2. Structures other than the above are the same as those in DLL circuit 100, and therefore description thereof is not repeated.

Figure 6:
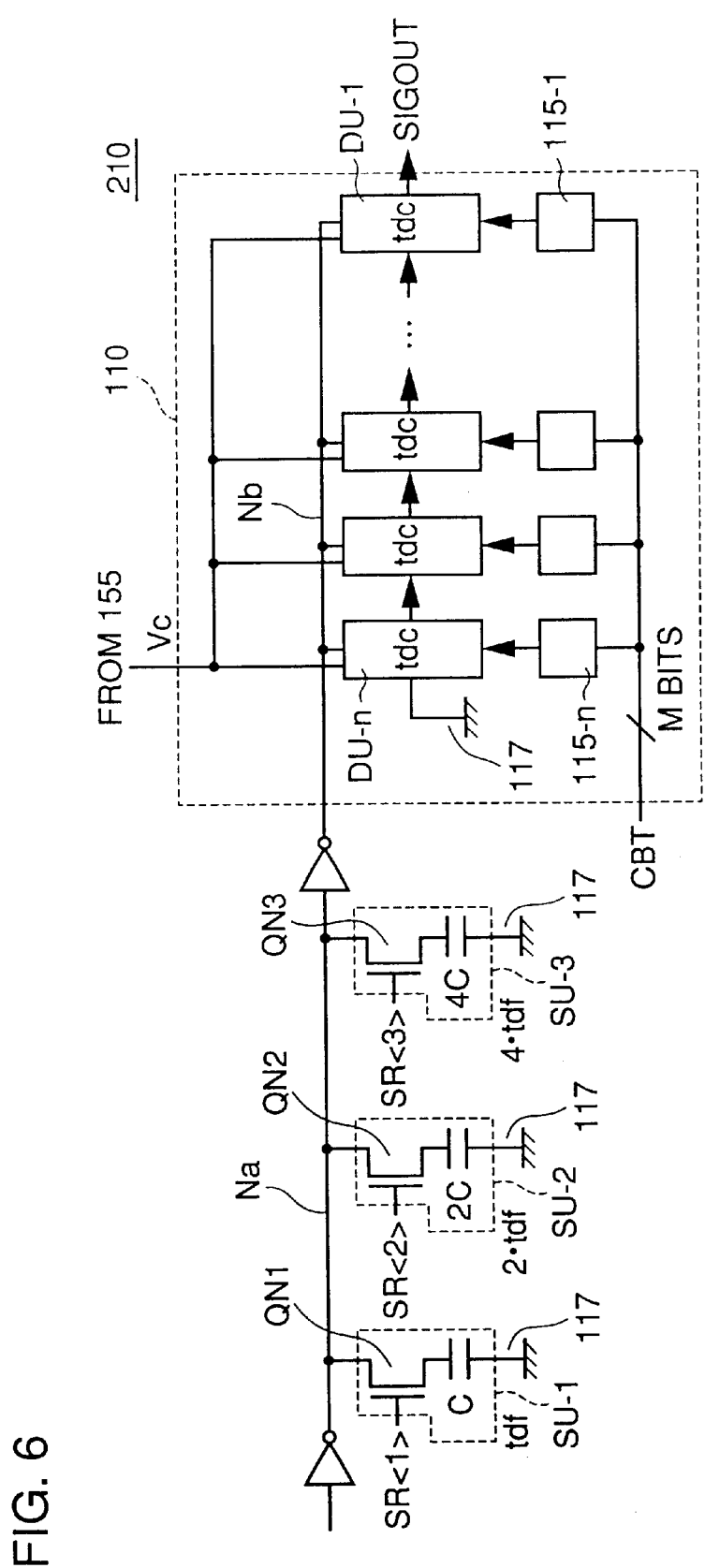
FIG. 6 is a block diagram showing a structure of a delay circuit 210 in a DLL circuit according to a second embodiment.

Referring to FIG. 6, a delay circuit 210 in the DLL circuit of the second embodiment includes the same structures as those of delay circuit 110 shown in FIG. 3, and further includes sub-delay units SU-1–SU-3. Sub-delay units SU-1–SU-3 are activated corresponding to sub-control signals SR<1>-SR<3>, respectively.

Sub-delay unit SU-1 has a transistor QN1 and a capacitor C1 which are connected in series between a node Na receiving a signal corresponding to input signal SIGIN and ground node 117. Transistor QN1 is turned on/off in response to sub-control signal SR<1>. Sub-delay units SU-2 and SU-3 have structures similar to that of sub-delay unit SU-1, but include capacitors of different capacitance values, respectively.

More specifically, the capacitors included in sub-delay units SU-1, SU-2 and SU-3 have the capacitance values of C, 2C and 4C, respectively. Thereby, the delay amount can be selectively set to eight values of 0 and tdf–7·tdf in accordance with combinations of signal levels of 3-bit sub-control signals SR<1>–SR<3>. The above value of tdf is the minimum delay amount which can be provided by sub-delay unit SU-1 connected to a capacitor having a capacitance value of C.

Description of the structures similar to those in delay circuit 110 is not repeated. The delay amount provided by each of delay units DU-1-DU-n is expressed as "tdc" for distinguishing it from the minimum delay amount of the sub-delay unit.

Delay units DU-1-DU-n are activated or inactivated in accordance with the decode result of the count signal produced by delay circuit control circuit 130, as already described with reference to FIG. 3. In the second embodiment, delay circuit control circuit 130 is merely required to produce a count signal of (M+3) bits in total corresponding to a sum of sub-control signals SR<1>–SR<3> already described and an M-bit count signal for controlling these delay units. More specifically, count-up signal CU and count-down signal CD corresponding to the result of phase comparison of phase comparator circuit 120 are processed such that the bit corresponding to sub-control signal SR<1> forms the lowest bit, and sub-control signals SR<2>, SR<3>, CBT<1>, . . . , CBT<M> are brought into correspondence with the count signals in this order, whereby activation of the delay units of n=$2^M$ in number and the three sub-delay units are controlled, and thereby the delay amount provided by delay circuit 210 can be controlled.

Similarly to the case of the first embodiment, drive potential Vc of each of delay units DU-1-DU-n can be controlled. This likewise allows control of delay amount tdc. The sub-delay units of three in number have been described by way of example only, and the plurality of sub-delay units other than three in number may be employed for setting the desired minimum delay amount.

If it is desired not to change the bit number M of the count bit signal by addition of the sub-delay unit(s), arrangement of the sub-delay units of L (L: a natural number) in number can be used for controlling activation/deactivation of the delay units of $2^{(M-L)}$ in number by the remaining (M-L) bits.

In the DLL circuit according to the second embodiment, the minimum delay amount can be set more finely by the sub-delay units in delay circuit 210. For efficient control, therefore, control of the total delay amount is roughly performed by controlling the number of the active delay units and the drive potential, and is finely controlled by controlling the activation of the sub-delay units.

Figure 7:
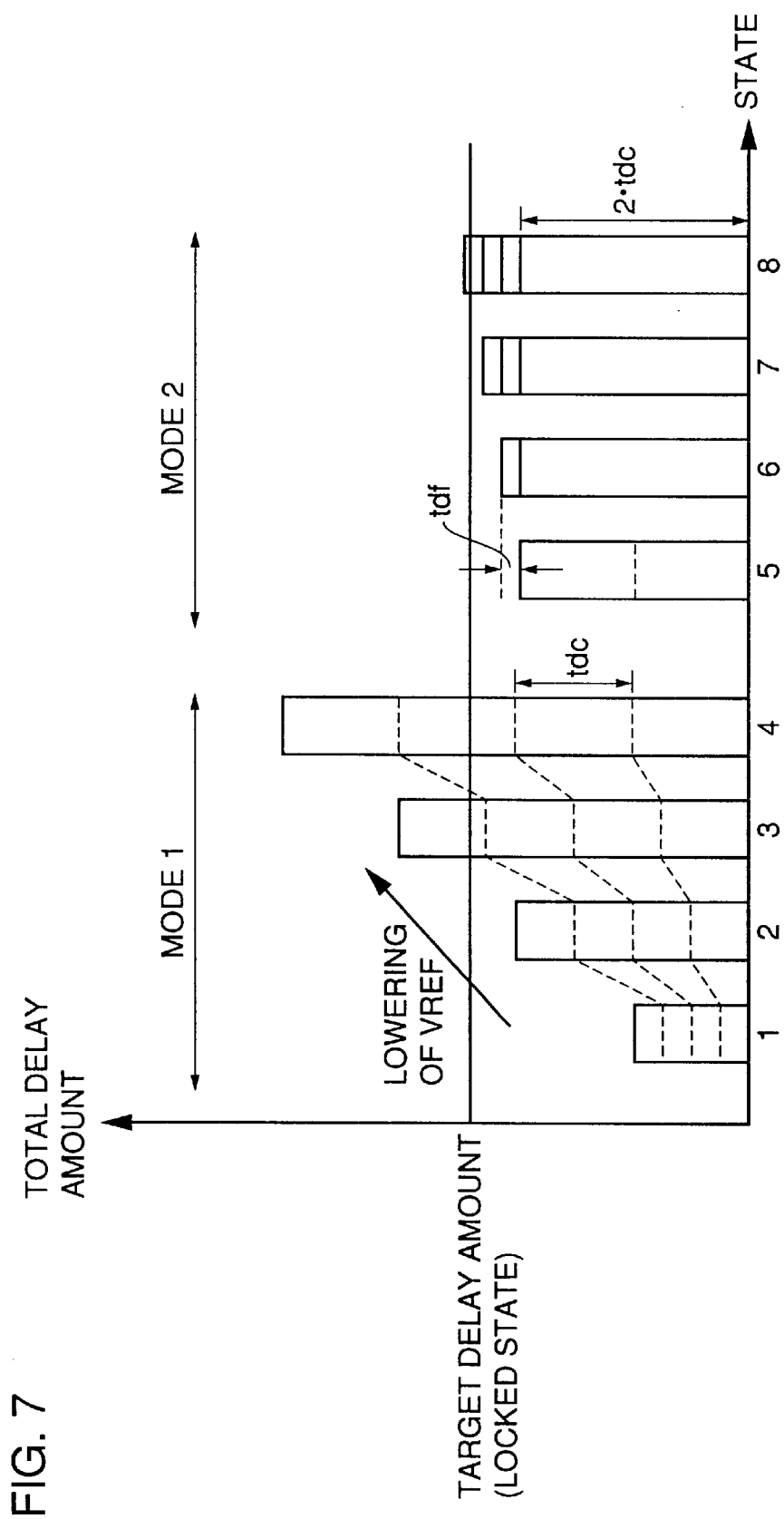
FIG. 7 conceptually shows a manner of setting a delay amount in a DLL circuit according to the second embodiment.

Referring to FIG. 7, description will now be made on a method of setting the delay amount in the DLL circuit according to the second embodiment. In FIG. 7, it is assumed that delay circuit 110 includes the four delay units.

Referring to FIG. 7, setting of the total delay amount is performed in two modes, i.e., a mode 1 for determining drive Vc and a mode 2 for activation control of the sub-delay units.

First, the mode 1 will be described. In a state 1, reference potential VREF is set such that drive potential Vc may take on the maximum value of the output voltage of voltage regulator 155. Thereby, delay amount tdc of each delay unit takes on the minimum value. Then, reference potential VREF is lowered for lowering drive potential Vc of the delay unit so that delay amount tdc provided by the delay unit gradually increases as can be seen in states 2 and 3.

Reference potential VREF is controlled to attain such a state that the target delay amount corresponding to the total delay amount in the locked state is in a predetermined range, and can be provided by a predetermined number of delay units.

In FIG. 7, reference potential VREF is set such that the target delay amount is in a range which is larger than the delay amount (2·tdc) corresponding to the two delay units, and is smaller than the delay amount (3·tdc) corresponding to the three delay units. This state is shown as a state 4 in FIG. 7.

Figure 8:
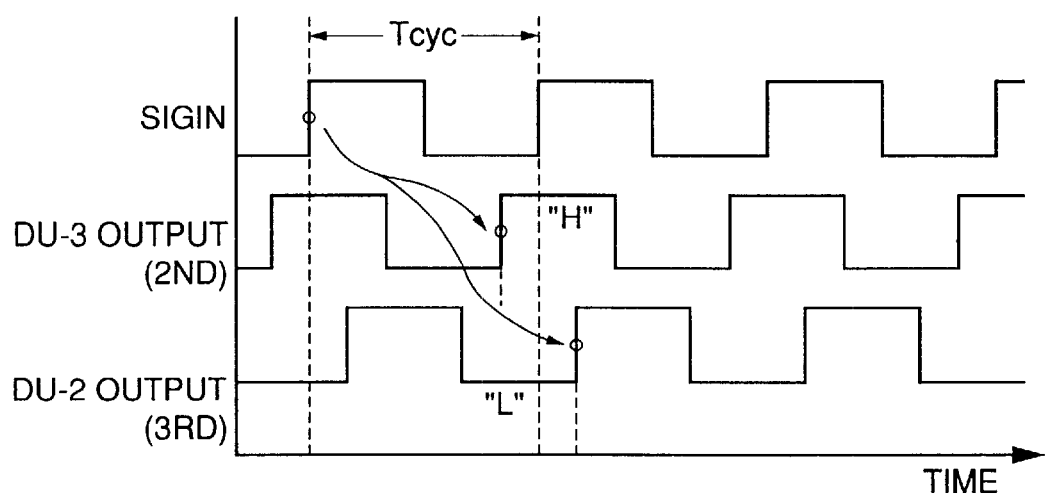
FIG. 8 shows by way of example a manner of verifying that a target delay amount is in a predetermined range.

Referring to FIG. 8, description will be given on an example of the method for determining that the target delay amount is in the predetermined range.

Referring to FIG. 8, cycle time Tcyc of input signal SIGIN corresponds to the target delay amount. By the control of reference potential VREF, drive potential Vc of the delay unit is changed, and the delay amount provided by each delay unit is changed. For providing the target delay amount within the predetermined range between the delay amount corresponding to the two delay units and the delay amount corresponding to the three delay units, the output of delay unit DU-3 in the second position viewed from the side of input signal SIGIN as well as the output of delay unit DU-2 in the third position are monitored, and the polarities of these output signals are detected in accordance with the timing of rising (from L-level to H-level) of input signal SIGIN. When the target delay amount is in the predetermined range, delay units DU-3 and DU-2 produce the outputs of different polarities, respectively, as shown in FIG. 8.

Referring to FIG. 7 again, reference potential VREF, i.e., drive potential Vc is determined in mode 1. Operations in mode 1 can be executed by DLL control circuit 160.

When drive potential Vc is determined, the initial value of count signal CBT is set corresponding to the state, in which the two delay units are activated, for transition from mode 1 to mode 2. For fixing drive potential Vc of the delay unit, reference potential fixing signal FXV is activated to attain L-level. Thereby, reference potential VREF is fixed independently of the result of phase comparison of phase comparator circuit 120, and drive potential Vc of the delay unit is also fixed.

In this state, activation of the sub-delay units in delay circuit 110 is controlled for matching the total delay amount of delay circuit 110 to the target delay amount. In a state 5, the two delay units are already activated by drive potential Vc, which is set in accordance with reference potential VREF corresponding to the state at the time of end of mode 1. In state 5, the phase comparison of phase comparator circuit 120 and renewal of count signal CBT based on the phase comparison result are performed, whereby the sub-delay units are activated one by one as can be seen in states 6–8 until the delay amount provided by delay circuit 110 becomes equal to the target delay amount.

Figure 9:
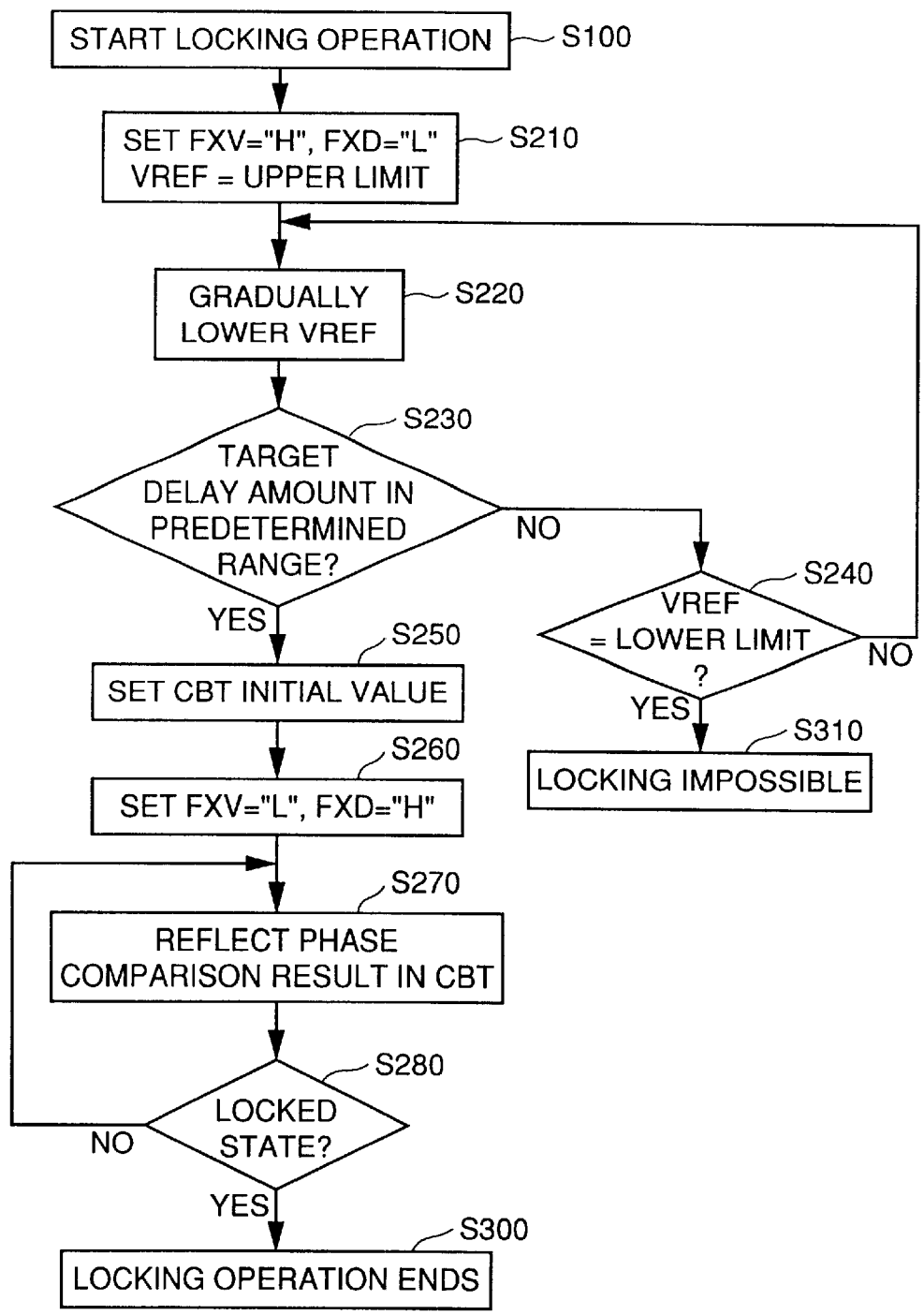
FIG. 9 is a flowchart showing control of the total delay amount according to the second embodiment.

FIG. 9 is a flowchart showing the control of the total delay amount in the second embodiment.

Referring to FIG. 9, when the DLL circuit starts the locking operation (step S100), the operation corresponding to mode 1 already described with reference to FIG. 7 is performed to control reference potential VREF, and for this purpose, reference potential fixing signal FXV and delay circuit fixing signal FXD are initially set to H- and L-levels, respectively (step S210). In and after this state, reference potential VREF is gradually lowered from the upper limit of the output voltage of voltage regulator 150 (step S220), and it is checked whether the target delay amount falls within the predetermined range (step S230).

Control of reference potential VREF is repeated until the target delay amount falls within the predetermined range as already described with reference to FIGS. 7 and 8 (step (S240). In some case, however, the total delay amount provided by all the delay units may not reach the target delay amount even if reference potential VREF takes on the lower limit value and the drive potential Vc of the delay unit takes on the minimum value. In this case, locking is impossible so that the control ends (step S310).

When state 4 in FIG. 7 is achieved by the control of reference potential VREF, mode 1 ends, and mode 2 starts. For setting the number of active delay units corresponding to state 4, the initial value of count signal CBT is set (step S250). In mode 2, the total delay amount is finely controlled by controlling the activation of the sub-delay units. In accordance with this, therefore, the signal levels of reference potential fixing signal FXV and delay circuit fixing signal FXD are changed from each other. Thereby, reference potential fixing signal FXV and delay circuit fixing signal FXD attain L- and H-levels, respectively (step S260).

Thereafter, the result of phase comparison of phase comparator circuit 120 is reflected in count signal CBT produced by delay circuit control circuit 130 so that the control of activation of the sub-delay units is executed (step S270). This control of activation is repeated until the total delay amount of delay circuit 110 becomes equal to the target delay amount, and thereby the locked state is attained (step S280). When locked, the setting control of the delay amount ends (step S300).

In the method described above, control of the total delay amount in the delay circuit is performed in hierarchical manners by the activation control of the delay units and the sub-delay units. Thereby, the precise locked state in which shift in phase is further reduced can be obtained.

Modification of the Second Embodiment

As a modification of the second embodiment, description will be made on another structure of the delay circuit which allows hierarchical control of the total delay amount.

Figure 10:
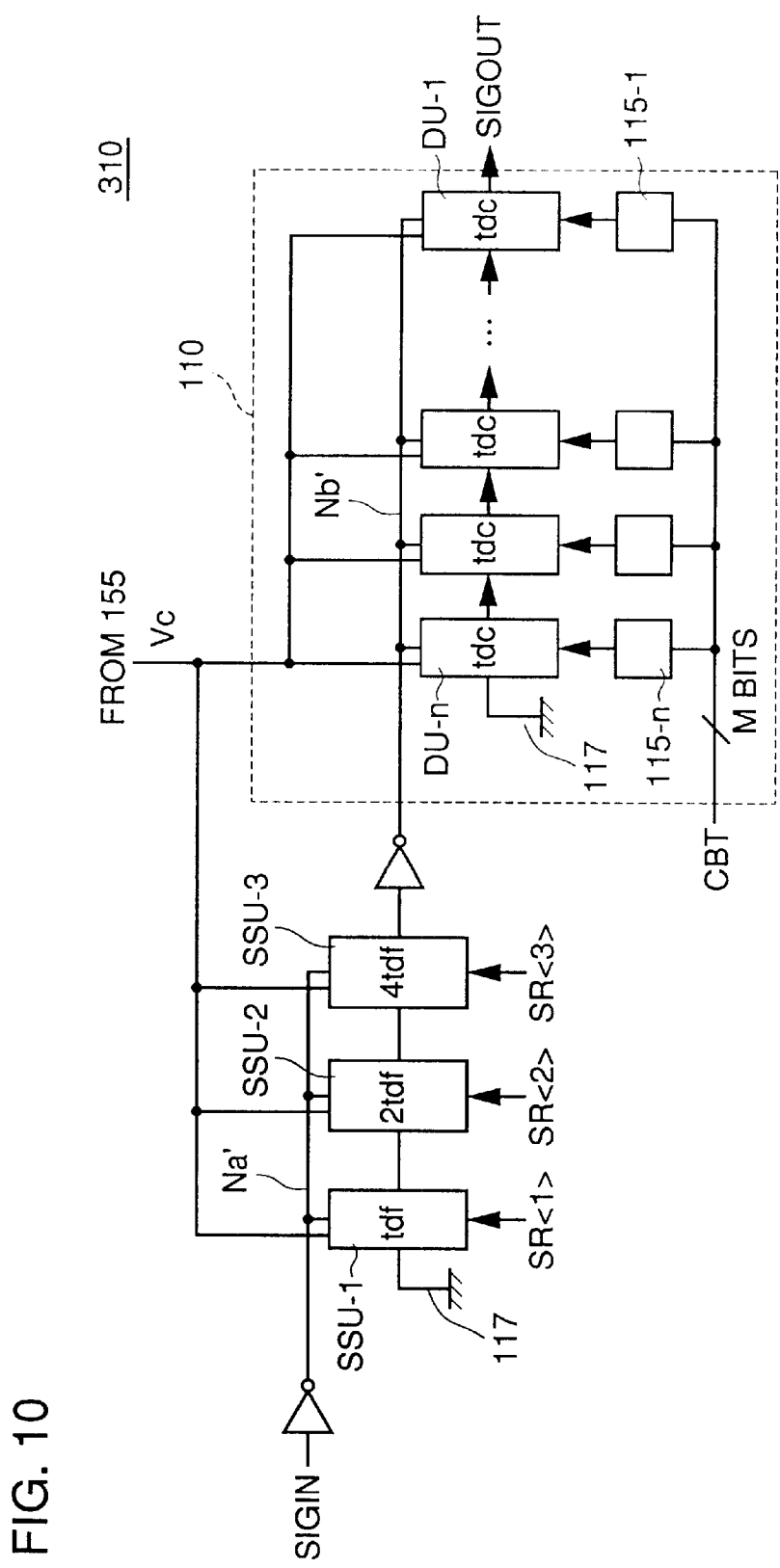
FIG. 10 is a block diagram showing a structure of a delay circuit 310 according to a modification of the second embodiment.

Referring to FIG. 10, a delay circuit 310 according to a modification of the second embodiment differs from delay circuit 210 shown in FIG. 6 in that sub-delay units SSU-1–SSU-3 are employed instead of sub-delay units SU-1–SU-3. Structures other than the above are the same as those of delay circuit 210, and therefore description thereof is not repeated.

FIG. 10 shows merely by way of example the three sub-delay units similarly to FIG. 6, and the sub-delay units other than three in number may be employed.

Sub-delay units SSU-1–SSU-3 are employed for providing delay amounts of tdf, 2·tdf and 4·tdf similarly to the structure in FIG. 6, but have structures different from those of delay units SU-1–SU-3 in FIG. 6, respectively.

Figure 11:
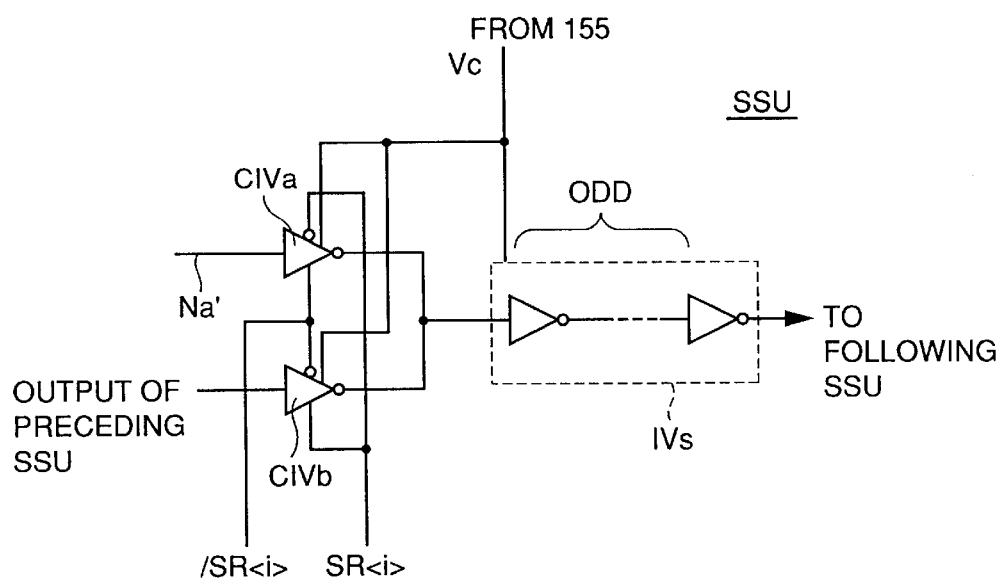
FIG. 11 is a circuit diagram showing a structure of a sub-delay unit in delay circuit 310.
Figure 12:
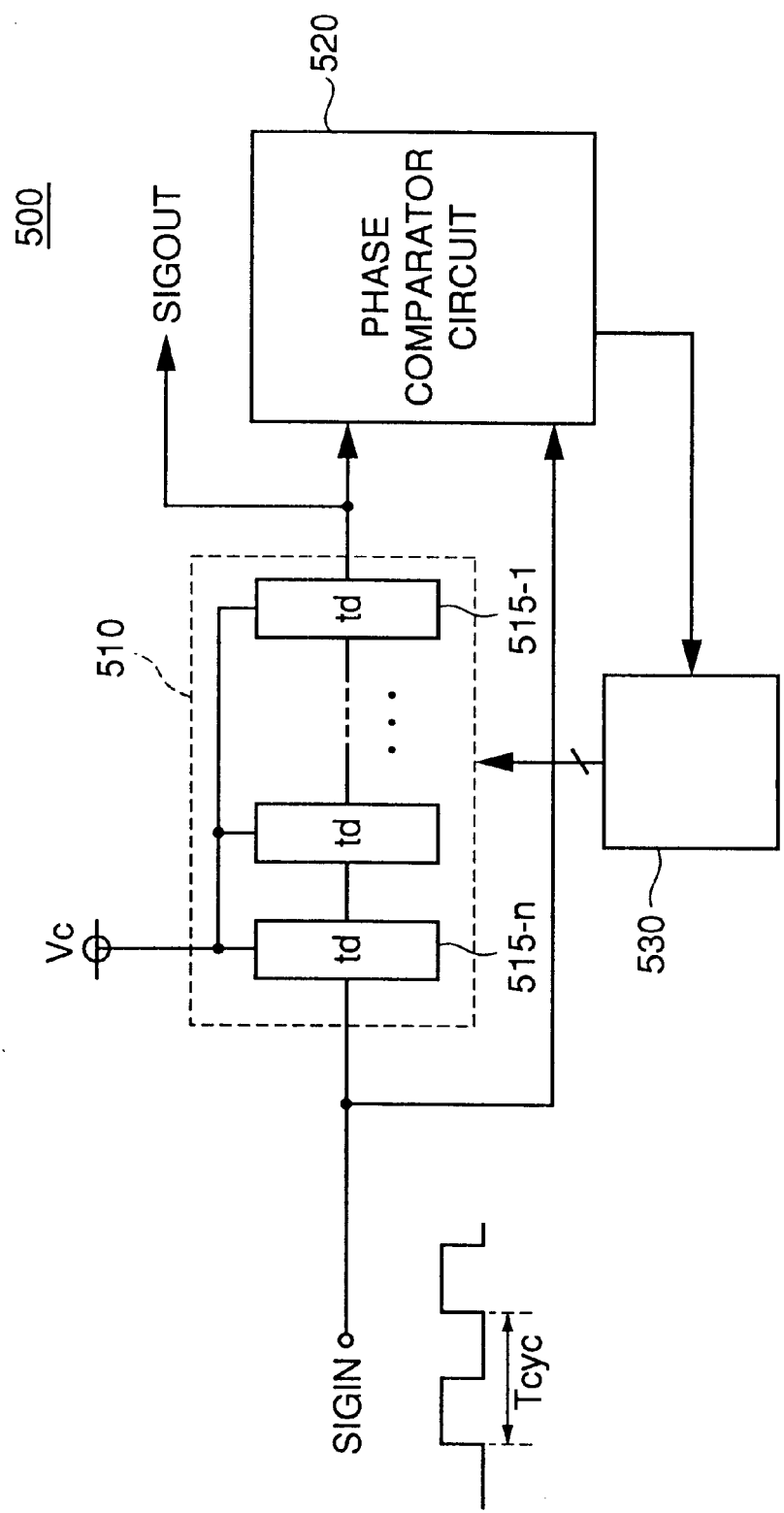
FIG. 12 is a block diagram showing a structure of a clock generating circuit 500 in the prior art employing digital DLL.
Figure 13:
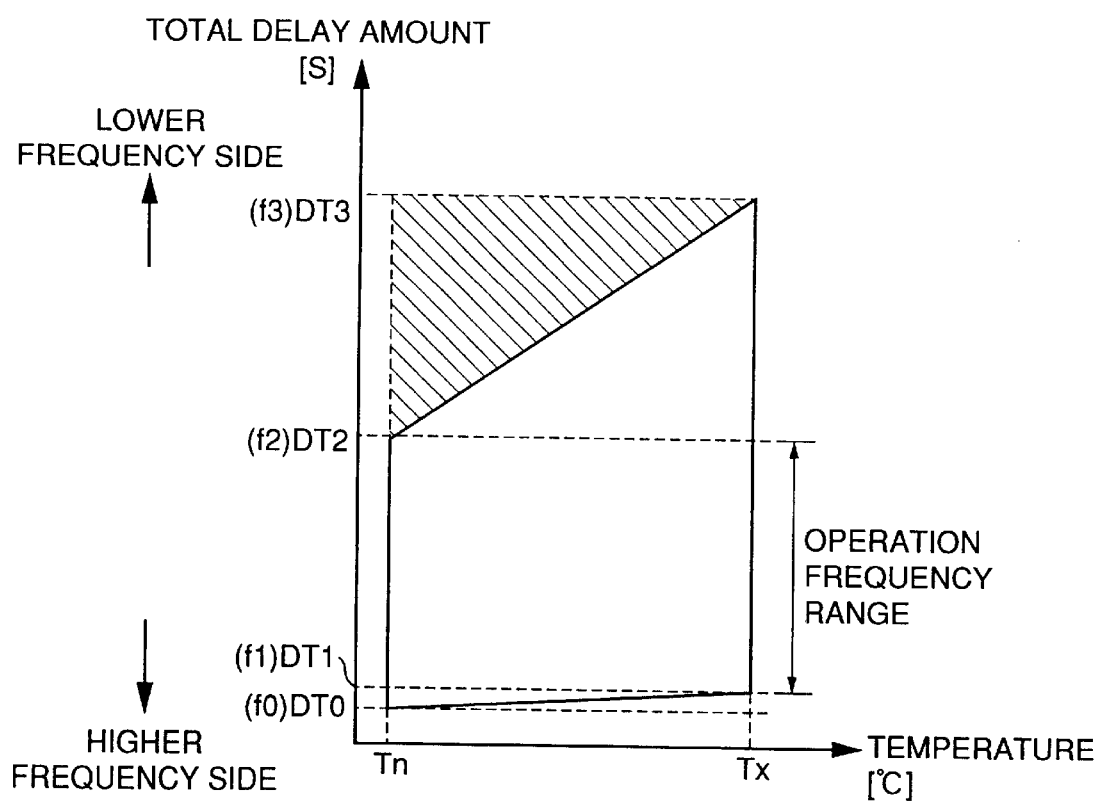
FIG. 13 conceptually shows a problem relating to temperature conditions of clock generating circuit 500 in the prior art.

In FIG. 11, sub-delay units SSU-1–SSU-3 are generally indicated by a reference "SSU". Referring to FIG. 11, sub-delay unit SSU has a structure similar to that of delay unit DU-i already described with reference to FIG. 4. More specifically, sub-delay unit SSU-j includes a clocked inverter CIVa having an input node which is connected to a node Na' receiving an inverted signal of input signal SIGIN, a clocked inverter CIVb receiving an output of the preceding sub-delay unit (or ground potential GND in sub-delay unit SSU-1), and a group IVs of an odd number of inverters.

In delay circuit 310 according to the third embodiment, each sub-delay unit and each delay unit have similar structures similar as described above, and the delay amount of each of them is determined in accordance with the number of the inverters included in inverter group IVs. More specifically, in the case where the sub-delay units are three in number for providing the minimum control unit which is equal to ⅛ of delay amount tdc per delay unit, inverter groups IVs in sub-delay units SSU-1, SSU-2 and SSU-3 include one inverter, three inverters and seven inverters, respectively, and inverter group IVs in each of delay units DU-1-DU-n includes 15 inverters, whereby delay amount tdc per delay unit can be equal to 8·tdf, and it is possible to set the target delay amount based on the minimum delay amount which is equal to ⅛ of the delay amount tdc of the delay unit.

In this manner, the delay unit and the sub-delay unit have the similar structures, and both of them are operated with common drive potential Vc, whereby the minimum delay amount can be controlled to be equal to a value obtained by accurately and equally dividing delay amount tdc per delay unit, even when delay amount tdc per delay unit changes in accordance with control of drive potential Vc. Thereby, the locked state in which shift in phase is further suppressed can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A clock generating circuit comprising:
    a delay circuit for delaying an input clock signal and outputting the delayed input clock signal,
    said delay circuit including a plurality of delay units for delaying said input clock signal by a first delay amount obtained by multiplying a first unit delay amount by L (L: a natural number), and
    said first unit delay amount changing in accordance with a drive potential of said plurality of delay units;
    a phase comparator circuit for making a comparison between phases of said input clock signal and the output signal of said delay circuit;
    a drive potential control circuit for controlling said drive potential in response to a result of phase comparison of said phase comparator circuit; and
    a delay control circuit for controlling said L in response to said result of phase comparison.

2. The clock generating circuit according to claim 1, wherein
    said drive potential control circuit includes:
        a potential regulator circuit for controlling said drive potential to a reference potential; and
        a reference potential generating circuit for controlling said reference potential in response to said result of phase comparison.

3. The clock generating circuit according to claim 1, further comprising:
- a delay unit fixing circuit arranged between said phase comparator circuit and said delay control circuit for stopping transmission of said result of phase comparison to said delay control circuit in response to activation of a first control signal;
- a drive potential fixing circuit arranged between said phase comparator circuit and said drive potential control circuit for stopping transmission of said result of phase comparison to said drive potential control circuit in response to activation of a second control signal; and
- a control circuit for producing said first and second control signals.

4. The clock generating circuit according to claim 3, wherein
said control circuit activates and inactivates said first and second control signals, respectively, and synchronizes said input signal with the output signal of said delay circuit by the control of said drive potential in response to said phase comparison result.

5. The clock generating circuit according to claim 4, wherein
said control circuit changes said L in response to said result of phase comparison by inactivating said first control signal and activating said second control signal, and thereafter performs activation of said first control signal and inactivation of said second control signal, if said input signal is not synchronized with the output signal of said delay circuit even when said drive potential reaches either the upper or lower limit of an available range.

6. The clock generating circuit according to claim 3, wherein
said control circuit activates at least one of said first and second control signals.

7. The clock generating circuit according to claim 1, wherein
each of said plurality of delay units has a plurality of inverters operating with said drive potential.

8. The clock generating circuit according to claim 1, wherein
said delay circuit further includes a plurality of sub-delay units for further delaying said input signal by a second delay amount obtained by multiplying a second unit delay amount by M (M is a non-negative integer),
said second unit delay amount is shorter than said first unit delay amount, and
said delay control circuit controls said L and M in response to the result of said phase comparison.

9. The clock generating circuit according to claim 8, wherein
said input clock signal has two signal levels equal to a first potential and a second potential lower than said first potential, respectively,
each of said plurality of sub-delay units has a switch and a capacitor connected in series between a node supplied with said input clock signal and a power supply node supplying said second potential, and
said control circuit controls said M by turning on/off said switch.

10. The clock generating circuit according to claim 8, wherein
each of said plurality of delay units has a plurality of inverters operating with said drive potential, and
each of said plurality of sub-delay units has a plurality of inverters operating with said drive potential and being smaller in number than said plurality of delay units.

11. The clock generating circuit according to claim 8, further comprising:
- a delay unit fixing circuit arranged between said phase comparator circuit and said delay control circuit for stopping transmission of said result of phase comparison to said delay control circuit in response to activation of a first control signal;
- a drive potential fixing circuit arranged between said phase comparator circuit and said drive potential control circuit for stopping transmission of said result of phase comparison to said drive potential control circuit in response to activation of a second control signal; and
- a control circuit for producing said first and second control signals.

12. The clock generating circuit according to claim 11, wherein said control circuit controls said first unit delay amount within a predetermined range under the control of said drive potential by activating and inactivating said first and second control signals, respectively, and thereafter controls said M in response to said result of phase comparison by inactivating and activating said first and second control signals, respectively, for synchronizing said input signal with the output signal of said delay circuit, and
said predetermined range is determined such that the cycle time of said input signal is at least a product of said first unit delay amount and N (N: a natural number smaller than L−1), and is not more than a product of said first unit delay amount and (N+1).

13. The clock generating circuit according to claim 11, wherein
said control circuit activates at least one of said first and second control signals.

14. A semiconductor memory device for operation in synchronization with an external clock signal, comprising:
- a memory cell array having a plurality of memory cells arranged in rows and columns;
- a data terminal for inputting and outputting data for writing and reading with respect to said memory cell array;
- a buffer circuit for executing data transmission between said memory cell array and said data terminal in response to an internal clock signal; and
- a clock generating circuit for generating said internal clock signal synchronized with said external clock signal,
said clock generating circuit including a delay circuit for delaying said external clock signal to generate said internal clock signal,
said delay circuit having a plurality of delay units for delaying said external clock signal by a first delay amount obtained by multiplying a first unit delay amount by L (L: a natural number),
said first unit delay amount changing in accordance with a drive potential of said plurality of delay units, and
said clock generating circuit further including,
a phase comparator circuit for making a comparison between phases of said external clock signal and said internal clock signal,
a drive potential control circuit for controlling said drive potential in response to a result of phase comparison of said phase comparator circuit, and a delay control circuit for controlling said L in response to said result of phase comparison.

15. The semiconductor memory device according to claim 14, wherein said clock generating circuit further includes:
- a delay unit fixing circuit arranged between said phase comparator circuit and said delay control circuit for stopping transmission of said result of phase comparison to said delay control circuit in response to activation of a first control signal;
- a drive potential fixing circuit arranged between said phase comparator circuit and said drive potential control circuit for stopping transmission of said result of phase comparison to said drive potential control circuit in response to activation of a second control signal; and
- a control circuit for producing said first and second control signals.

16. The semiconductor memory device according to claim 14, wherein said delay circuit further includes a plurality of sub-delay units for further delaying said input signal by a second delay amount obtained by multiplying a second unit delay amount by M (M is a non-negative integer), said second delay amount is shorter than said first unit delay amount, and said delay control circuit controls said L and M in response to the result of said phase comparison.

17. The semiconductor memory device according to claim 16, wherein said clock generating circuit further includes:
- a delay unit fixing circuit arranged between said phase comparator circuit and said delay control circuit for stopping transmission of said result of phase comparison to said delay control circuit in response to activation of a first control signal;
- a drive potential fixing circuit arranged between said phase comparator circuit and said drive potential control circuit for stopping transmission of said result of phase comparison to said drive potential control circuit in response to activation of a second control signal; and
- a control circuit for producing said first and second control signals.

* * * * *